United States Patent
Naruhashi et al.

(10) Patent No.: US 11,407,863 B2
(45) Date of Patent: *Aug. 9, 2022

(54) COATED PARTICLES AND PRODUCTION METHOD THEREFOR

(71) Applicant: NIPPON CHEMICAL INDUSTRIAL CO., LTD., Tokyo (JP)

(72) Inventors: Tomonao Naruhashi, Tokyo (JP); Natsuhiro Sano, Tokyo (JP); Eri Furui, Tokyo (JP)

(73) Assignee: NIPPON CHEMICAL INDUSTRIAL CO., LTD., Tokyo (JP)

( * ) Notice: Subject to any disclaimer, the term of this patent is extended or adjusted under 35 U.S.C. 154(b) by 442 days.

This patent is subject to a terminal disclaimer.

(21) Appl. No.: 16/605,376

(22) PCT Filed: Apr. 25, 2018

(86) PCT No.: PCT/JP2018/016880
§ 371 (c)(1),
(2) Date: Oct. 15, 2019

(87) PCT Pub. No.: WO2018/207628
PCT Pub. Date: Nov. 15, 2018

(65) Prior Publication Data
US 2021/0122886 A1    Apr. 29, 2021

(30) Foreign Application Priority Data

May 8, 2017  (JP) .............................. JP2017-092626
Aug. 28, 2017 (JP) .............................. JP2017-163387
Nov. 28, 2017 (JP) .............................. JP2017-228343

(51) Int. Cl.
*C08J 3/12*     (2006.01)
*B22F 1/102*    (2022.01)
(Continued)

(52) U.S. Cl.
CPC ............... *C08J 3/126* (2013.01); *B22F 1/16* (2022.01); *C08F 230/02* (2013.01); *C08J 3/098* (2013.01);
(Continued)

(58) Field of Classification Search
CPC . H01B 5/00; H01B 5/16; C08F 212/08; C08J 3/128; C08K 3/08; C08K 5/3475
See application file for complete search history.

(56) References Cited

U.S. PATENT DOCUMENTS

2004/0109995 A1  6/2004 Wakiya et al.
2006/0154070 A1  7/2006 Wakiya et al.
(Continued)

FOREIGN PATENT DOCUMENTS

CN  101036423 A  9/2007
CN  101432081 A  5/2009
(Continued)

OTHER PUBLICATIONS

International Search Report dated Jul. 17, 2018, issued in counterpart International Application No. PCT/JP2018/016880(1 page).

*Primary Examiner* — Alexandre F Ferre
(74) *Attorney, Agent, or Firm* — WHDA, LLP (57) ABSTRACT

A coated particle according to the present invention is a coated particle containing a conductive metal-coated particle having a metal film formed on a surface of a core material, the conductive metal-coated particle coated with an insulation layer containing a polymer, wherein the insulation layer has a phosphonium group. The insulation layer preferably contains an insulating fine particle and the fine particle has a phosphonium group on a surface thereof, or the insulation layer is preferably a film having a phosphonium group. In addition, the metal is preferably at least one selected from nickel, gold, nickel alloys, and gold alloys.

(Continued)

PRODUCTION EXAMPLE 1 INSULATING FINE PARTICLES

The polymer constituting the insulation layer is preferably at least one polymerized product selected from styrenes, esters, and nitriles.

18 Claims, 6 Drawing Sheets

(51) Int. Cl.
*C08F 230/02* (2006.01)
*C08J 3/09* (2006.01)
*B22F 1/16* (2022.01)

(52) U.S. Cl.
CPC ........ *C08J 2325/08* (2013.01); *C08J 2333/18* (2013.01); *C08J 2367/00* (2013.01)

(56) References Cited

U.S. PATENT DOCUMENTS

| | | |
|---|---|---|
| 2008/0038468 A1 | 2/2008 | Kawamura |
| 2009/0258241 A1 | 10/2009 | Shiraishi et al. |

FOREIGN PATENT DOCUMENTS

| | | |
|---|---|---|
| CN | 102884590 A | 1/2013 |
| CN | 104662198 A | 5/2015 |
| JP | 2003-317827 A | 11/2003 |
| JP | 2005-149764 A | 6/2005 |
| JP | 2007-537572 A | 12/2007 |
| WO | 02/35555 A1 | 5/2002 |
| WO | 2003025955 A1 | 1/2005 |
| WO | 2005/109448 A1 | 11/2005 |

[Figure 1]

PRODUCTION EXAMPLE 1 INSULATING FINE PARTICLES

[Figure 2]

PRODUCTION EXAMPLE 2 INSULATING FINE PARTICLES

[Figure 3]

PRODUCTION EXAMPLE 3 INSULATING FINE PARTICLES

[Figure 4]

EXAMPLE 1 COATED PARTICLE

[Figure 5]

EXAMPLE 2 COATED PARTICLE

[Figure 6]

EXAMPLE 3 COATED PARTICLE

[Figure 7]

EXAMPLE 4 COATED PARTICLE

[Figure 8]

EXAMPLE 5 COATED PARTICLE

[Figure 9]

EXAMPLE 6 COATED PARTICLE

[Figure 10]

COMPARATIVE EXAMPLE 1 COATED PARTICLE

[Figure 11]

COMPARATIVE EXAMPLE 2 COATED PARTICLE

COATED PARTICLES AND PRODUCTION METHOD THEREFOR

TECHNICAL FIELD

The present invention relates to a coated particle coated with an insulation layer and a method for producing the same.

BACKGROUND ART

A conductive particle having a metal such as nickel or gold formed on the surface of a resin particle is used as a conductive material for a conductive adhesive, an anisotropic conductive film, an anisotropic conductive adhesive, or the like.

In recent years, the circuit width and pitch of an electronic circuit have been made smaller and smaller with further miniaturization of electronic devices. As a conductive particle used for the above-described conductive adhesive, anisotropic conductive film, an anisotropic conductive adhesive, or the like, a conductive particle having a small particle diameter has been demanded with the reduction in size of the circuit width and pitch of electronic devices. When such a conductive particle having a small particle diameter is used, the amount of the conductive particle to be blended has to be increased in order to enhance the connectivity of the conductive particle. However, when the amount of the conductive particle blended is increased, short circuit occurs due to conduction in an unintended direction, namely conduction in a direction different from the inter-counter electrode direction, occurs, so that an insulation property in the direction is difficult to obtain, resulting in a problem. In order to solve this problem, an insulating coated conductive particle in which the surface of a conductive particle is coated with an insulating substance to thereby prevent contact between metal layers of the conductive particles has been used.

For example, Patent Literature 1 describes a coated particle obtained by using as a core a conductive particle having a surface composed of a metal, and partly modifying the surface with an organic particle composed of an organic compound containing a functional group having a bonding property to the metal, wherein the organic compound has a positive or negative charge.

In addition, Patent Literature 2 describes a coated particle similar to the coated particle in Patent Literature 1. It is described in the literature that an insulating fine particle is chemically bonded to a conductive particle having a surface composed of a metal through a functional group having a bonding property to a metal, and the coated particle thereby forms a coating layer which is a single layer. It is described in the literature that when the coated particles are thermocompression-bonded between electrodes, the insulating fine particle thereby melts, deforms, or peels, so that the metal surface of the metal-coated particle is exposed, and the conduction between electrodes is thereby enabled and the connectivity is obtained. In Patent Literatures 1 and 2, an ammonium group and a sulfonium group are given as examples of the above-described functional group.

In addition, it is described in Patent Literature 3 that when an insulating fine resin particle containing on the surface thereof a hetero atom or a functional group having bonding ability to a metal is applied on a surface of a metal-coated particle, and a resultant particle is heated, an anisotropically insulating conductive particle having an insulation layer formed on the metal-coated particle, the insulation layer not having a particle shape, is thereby obtained.

CITATION LIST

Patent Literature

Patent Literature 1: US2004109995 A1
Patent Literature 2: US2006154070 A1
Patent Literature 3: International Publication No. WO 2005/109448

SUMMARY OF INVENTION

However, in the conventional coated particle coated with the insulating fine particle containing a functional group, the particle described in Patent Literatures 1 and 2, it cannot be said that a close adhesion property between the insulating fine particle and the metal-coated particle is sufficient, so that there has been room for improvements in that conduction between counter electrodes has to be achieved while obtaining the insulation property in directions different from the inter-counter electrode direction (hereinafter, also simply referred to as connection reliability).

In addition, with respect to the coated conductive particle described in Patent Literature 3, the functional group of the insulating fine particle in the metal-coated particle in a state of being coated with the insulating fine particle which is an intermediate before heating, and the film obtained by heating the insulating fine particle do not have a charge, and therefore it has been difficult to obtain the close adhesion property to the metal-coated particle. Even if the insulating fine particle can be made to adhere to the surface of the metal-coated particle, it has been difficult to make the insulating fine particle into a single layer on the surface of the metal-coated particle because the functional group does not have a charge. From these standpoints, there has been room for improvements in terms the connection reliability of the coated particle obtained by heating this insulating fine particle.

Thus, an object of the present invention is to provide an insulating coated conductive particle that is more excellent in the close adhesion property between an insulating substance and a conductive particle than a conventional one and is more excellent than ever in connection reliability as a conductive material for a conductive adhesive, an anisotropic conductive film, an anisotropic conductive adhesive, or the like.

The present inventors have conducted diligent studies in order to solve the above-described problems to find that as an insulating substance, a polymer having a phosphonium group on the surface thereof is excellent in affinity with a metal layer, and therefore peeling from the metal-coated particle is suppressed as compared to a conventional technique, so that the polymer can have as a coated conductive material excellent connection reliability that has never been realized, and thereby completed the present invention.

That is, the present invention provides a coated particle containing a conductive metal-coated particle having a metal film formed on a surface of a core material, the metal-coated particle coated with an insulation layer containing a polymer,
wherein the insulation layer has a phosphonium group.

In addition, the present invention provides a method for producing a coated particle containing a metal-coated particle having a metal formed on a surface of a core material, the metal-coated particle coated with an insulation layer containing a polymer, the method including:
- a step of polymerizing a polymerizable composition containing a polymerizable compound having a phosphonium group, thereby obtaining an insulating fine particle having a phosphonium group on a surface thereof; and
- a step of mixing a dispersion liquid containing the insulating fine particle with the metal-coated particle, thereby allowing the insulating fine particle to adhere to a surface of the metal-coated particle.

DESCRIPTION OF EMBODIMENTS

Hereinafter, the present invention will be described based on the preferred embodiments.

A coated particle according to the present embodiment is a coated particle containing a conductive metal-coated particle having a metal film formed on a surface of a core material, the metal-coated particle coated with an insulation layer containing a polymer, wherein the insulation layer has a phosphonium group.

As the metal-coated particle, a known metal-coated particle that has conventionally been used for a conductive adhesive, an anisotropic conductive film, or an anisotropic conductive adhesive can be used.

The core material in the metal-coated particle is in the form of particles, and any of inorganic substances and organic substances can be used without particular limitations. Examples of the core material particle of an inorganic substance include a metal particle of gold, silver, copper, nickel, palladium, solder, or the like, alloy, glass, ceramics, silica, metal or non-metal oxides (including hydrated compounds), metal silicates including aluminosilicate, metal carbides, metal nitrides, metal carbonates, metal sulfonates, metal phosphates, metal sulfides, metallates, metal halides, and carbon. On the other hand, examples of the core material particle of an organic substance include natural fibers, natural resins, thermoplastic resins such as polyethylene, polypropylene, polyvinyl chloride, polystyrene, polybutene, polyamide, polyacrylic acid esters, polyacrylonitrile, polyacetal, ionomers, and polyesters, alkyd resins, phenol resins, urea resins, benzoguanamine resins, melamine resins, xylene resins, silicone resins, epoxy resins, and diallyl phthalate resins. These may be used singly or in combinations of two or more thereof. Among these, a core material particle composed of a resin material is preferable in that the core material has a smaller specific gravity and it is harder for the core material to undergo sedimentation, and therefore the core material has more excellent dispersion stability, and electrical connection is easier to keep due to the elasticity of the resin, as compared to a core material particle composed of a metal.

When the organic substance is used as the core material particle, it is preferable that the organic substance not have a glass transition temperature or have a glass transition temperature of higher than 100° C. from the standpoint that the shape of the core material particle is easily kept in an anisotropic conductive connection step and the shape of the core material particle is easy to keep in a step of forming a metal film. In addition, when the core material particle has a glass transition temperature, the glass transition temperature is preferably 200° C. or lower from the standpoint that the conductive particle easily softens in anisotropic conductive connection to make the contact area large, and thereby conduction is easily achieved. From this viewpoint, when the core material particle has a glass transition temperature, the glass transition temperature is more preferably higher than 100° C. and 180° C. or lower, and is particularly preferably higher than 100° C. and 160° C. or lower. The glass transition temperature can be measured by the method described in Examples, which will be described later.

In the case where the organic substance is used as the core material particle, when the organic substance is a highly crosslinked resin, the glass transition temperature is hardly measured even if the measurement is attempted up to 200° C. by the method described in the Examples below. In the present specification, such a particle is also referred to as a "particle not having a glass transition temperature," and in the present invention, such a core material particle may be used. As a specific example of the material for the above-described core material particle not having a glass transition temperature, the material can be obtained by copolymerization using a crosslinkable monomer together with a monomer constituting the organic substance exemplified above. Examples of the crosslinkable monomer include multifunctional (meth)acrylates such as tetramethylene di(meth)acrylate, ethylene glycol di(meth)acrylate, polyethylene glycol di(meth)acrylate, polypropylene glycol di(meth)acrylate, ethylene oxide di(meth)acrylate, tetraethylene oxide di(meth)acrylate, 1,6-hexane di(meth)acrylate, neopentyl glycol di(meth)acrylate, 1,9-nonanediol di(meth)acrylate, trimethylolpropane tri(meth)acrylate, tetramethylolmethane di(meth)acrylate, tetramethylolmethane tri(meth)acrylate, tetramethylolmethane tetra(meth)acrylate, tetramethylolpropane tetra(meth)acrylate, dipentaerythritol penta(meth)acrylate, glycerol di(meth)acrylate, and glycerol tri,di(methacrylate); multifunctional vinyl-based monomers such as divinylbenzene and divinyltoluene; silane-containing monomers such as vinyltrimethoxysilane, trimethoxysilyl styrene, γ-(meth)acryloxy propyl trimethoxy silane; and monomers such as triallyl isocyanurate, diallyl phthalate, diallyl acrylamide, and diallyl ether. Particularly in the COG (Chip on Glass) field, a large number of core material particles using such a hard organic material are used.

There are no limitations in the shape of the core material particle. Generally, a core material particle is spherical. However, the core material particle may have a shape other than a spherical shape such as, for example, a fibrous shape, a hollow shape, a plate shape, or a needle shape, or may have a shape having a large number of protrusions on the surface thereof or may be amorphous. In the present invention, a spherical core material particle is preferable in that such a core material particle is excellent in filling ability and is easily coated with a metal.

There are no particular limitations in the shape of the metal-coated particle although the shape depends on the shape of the core material particle. For example, the metal-coated particle may have a fibrous shape, a hollow shape, a plate shape, or a needle shape, or may have a shape having a large number of protrusions on the surface thereof or may be amorphous. In the present invention, a spherical shape or a shape having a large number of protrusions is preferable in that such a shape gives excellent filling ability and connectivity.

The metal film in the metal-coated film has conductivity, and examples of the metal constituting the metal film include metals such as gold, platinum, silver, copper, iron, zinc, nickel, tin, lead, antimony, bismuth, cobalt, indium, titanium, antimony, bismuth, germanium, aluminum, chromium, palladium, tungsten, and molybdenum, or alloys thereof, and metal compounds such as ITO and solder. Among them, gold, silver, copper, nickel, palladium, or solder is preferable because of small resistance, and among others, nickel, gold, a nickel alloy, or a gold alloy is suitably used because of an enhanced bonding property to the phosphonium group in the insulating fine particle. The metals can be used singly or in combinations of two or more thereof in the metal-coated particle.

The metal film may have a single layer structure or a laminated structure including a plurality of layers. When the metal film has a laminated structure including a plurality of layers, the outermost layer is preferably nickel, gold, a nickel alloy, or a gold alloy.

In addition, the metal film does not have to coat the whole surface of the core material particle and may coat only a part of the surface. When the metal film coats only a part of the surface of the core material particle, the coating part does not have to be continuous, and, for example, the metal film may coat the surface discontinuously in island shapes. The thickness of the metal film is preferably 0.001 μm or more and 2 μm or less.

The average particle diameter of the metal-coated particle is preferably 0.1 μm or more and 50 μm or less, and more preferably 1 μm or more and 30 μm or less. When the average particle diameter of the metal-coated particle is in the range, a resultant coated particle thereby does not bring about the occurrence of short circuit in a direction different from the inter-counter electrode direction, so that conduction between counter electrodes is easily secured. It is to be noted that in the present invention, the average particle diameter of the metal-coated particle is a value measured using a scanning electron microscope (Scanning Electron Microscope: SEM). Specifically, the average particle diameter of the metal-coated particle is measured by the method described in Examples. It is to be noted that the particle diameter is a diameter of a circular image of an insulating fine particle. When the insulating fine particle is not spherical, the particle diameter refers to the longest length (maximum length) among the line segments crossing the image of the insulating fine particle.

Examples of a method for forming the metal film on the surface of the core material particle include a dry process utilizing a vapor deposition method, a sputtering method, a mechanochemical method, a hybridization method, or the like, and a wet process utilizing an electroplating method, an electroless plating method, or the like. In addition, the metal film may be formed on the surface of the core material particle by combining these methods.

The insulation layer coating the metal-coated particle is constituted of a polymer and has a phosphonium group. Thereby, the coated particle according to the present invention has a more enhanced close adhesion property between the metal-coated particle and the insulation layer as compared to a conventional coated particle having an insulation layer having a sulfonium group or an ammonium group. Therefore, the coated particle according to the present invention easily exhibits a short circuit prevention effect by the insulation layer in directions different from the inter-counter electrode direction, so that an enhancement in the insulation property in the directions can be expected.

The insulation layer in the present invention includes an insulation layer containing an insulating fine particle and the fine particle has a phosphonium group on the surface thereof, or the insulation layer is a continuous film having a phosphonium group. The continuous film means excluding that the material constituting the insulation layer exists in a state of scattered dots. The continuous film does not have to be a complete film, and when the continuous film coats a part of the surface of the metal-coated particle, the coating part of the film may be continuous, or the film may coat the surface discontinuously in island shapes.

Firstly, the case where the insulation layer contains an insulating fine particle and the fine particle has a phosphonium group on the surface thereof will be described. In this case, the coated particles are thermocompression-bonded between electrodes; the insulating fine particle is thereby melted, deformed, and peeled or allowed to move on the surface of the metal-coated particle; and the metal surface of the metal-coated particle at the part where the thermocompression bonding has been performed is thereby exposed, thereby enabling conduction between electrodes, so that connectivity is obtained. On the other hand, in the surface parts each facing a direction other than the thermocompression bonding direction in the coated particle, the coated state of the metal surface with the insulating fine particle is almost retained and therefore conduction in directions other than the thermocompression bonding direction is prevented.

The insulating fine particle has a phosphonium group on the surface thereof, and thereby easily adheres closely to the metal-coated particle, and the proportion of the surface coated with the insulating fine particle on the surface of the metal-coated particle can thereby be made sufficient, and peeling of the insulating fine particle from the metal-coated particle is prevented effectively. Therefore, the short circuit prevention effect by the insulating fine particle in directions different from the inter-counter electrode direction is easily exhibited, so that an improvement in the insulation property in the directions can be expected.

In addition, in the coated particle according to the present invention, the insulating fine particles having a positive charge due to the phosphonium group repel each other, and thereby a single layer of the insulating fine particle is easily formed on the surface of the metal-coated particle. Accordingly, when the coated particle according to the present invention is used for an anisotropic conductive material or the like, conductive failure accompanying thermocompression bonding, the conduction failure caused by the existence of the insulating fine particles in a multilayered state is prevented effectively, so that an improvement in the connectivity can be expected.

Accordingly, the connection reliability can be improved by the coated particle according to the present invention, wherein the insulation layer contains the insulating fine particle.

In the present specification, when the insulating fine particle has a phosphonium group, and it can be ascertained by scanning electron microscope observation that the insulating fine particle adheres to the surface of the metal-coated particle, the insulating fine particle corresponds to "the insulating fine particle having a phosphonium group on the surface thereof."

There are no particular limitations in the shape of the insulating fine particle, and the shape may be spherical or may be a shape other than a spherical shape. Examples of the shape other than the spherical shape include a fibrous shape, a hollow shape, a plate shape, or a needle shape. In addition, the insulating fine particle may be an insulating fine particle having a large number of protrusions on the surface thereof or an amorphous insulating fine particle. A spherical insulating fine particle is preferable in terms of the adhesion property to the metal-coated particle and easiness of synthesis. The insulating fine particle itself is preferably an insulating fine particle not having a core-shell structure such that a shell particle has adhered to the surface of a core particle.

As a part of the substance constituting the insulating fine particle, the phosphonium group in the insulating fine particle preferably constitutes a part of the chemical structure of the substance. In the insulating fine particle, the phosphonium group is preferably contained in the structure of at least one of the constituent units of the polymer constituting the insulating fine particle. The phosphonium group is preferably chemically bonded to the polymer constituting the insulating fine particle and is more preferably bonded to a side chain of the polymer.

The phosphonium group is preferably represented by the following general formula (2).

[Formula 1]

(2)

wherein each R represents a straight-chain, branched-chain, or cyclic alkyl group, or an aryl group, and may be the same or different, and * represents a bond.

The straight-chain alkyl group represented by R includes a methyl group, an ethyl group, a n-propyl group, a n-butyl group, a n-pentyl group, a n-hexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, a n-icosyl group, and the like.

The branched-chain alkyl group represented by R includes an isopropyl group, an isobutyl group, an s-butyl group, a t-butyl group, an isopentyl group, an s-pentyl group, a t-pentyl group, an isohexyl group, an s-hexyl group, a t-hexyl group, an ethylhexyl group, and the like.

The cyclic alkyl group represented by R includes cycloalkyl groups such as a cyclopropyl group, a cyclobutyl group, a cyclopentyl group, a cyclohexyl group, a cycloheptyl group, a cyclooctyl group, and a cyclooctadecyl group; and the like.

The aryl group represented by R includes a phenyl group, a benzyl group, a tolyl group, an o-xylyl group, and the like.

R is preferably an alkyl group having 1 to 12 carbon atoms, more preferably an alkyl group having 1 to 10 carbon atoms, and most preferably an alkyl group having 1 to 8 carbon atoms from the standpoint of enhancing the close adhesion property between the metal-coated particle and the insulating fine particle and the standpoint of detaching the insulating fine particle from the metal-coated particle to make it easy to secure conduction when thermocompression bonding is performed inside an anisotropic conductive film. Also, R is preferably a straight-chain alkyl group from the standpoint of making it easy to allow the insulating fine particle to come close and adhere closely to the metal-coated particle.

The polymer constituting the insulating fine particle is preferably a polymerized product of a polymerizable compound having an ethylenically unsaturated bond. The polymerizable compound having an ethylenically unsaturated bond includes styrenes, olefins, esters, α,β-unsaturated carboxylic acids, amides, nitriles, and the like. The styrenes include styrene, nucleus-substituted styrenes such as o, m, p-methylstyrene, dimethylstyrene, ethylstyrene, and chlorostyrene; and styrene derivatives such as α-methylstyrene, α-chlorostyrene, and β-chlorostyrene; and the like. The olefins include ethylene, propylene, and the like. The esters include vinyl esters such as vinyl acetate, vinyl propionate, and vinyl benzoate; and (meth)acrylic acid esters such as methyl (meth)acrylate, ethyl (meth)acrylate, propyl (meth)acrylate, and phenyl (meth)acrylate; and the like. The α,β-unsaturated carboxylic acids include acrylic acid, methacrylic acid, itaconic acid, maleic acid, and the like. Salts of these α,β-unsaturated carboxylic acids are also included in the α,β-unsaturated carboxylic acids. The amides include acrylamide, methacrylamide, and the like. The nitriles include acrylonitrile, and the like. These may be further substituted, and substituents include a phosphonium group, an amino group, a quaternary ammonium group, an amide group, a sulfonium group, a sulfonic acid group, a thiol group, a carboxyl group, a phosphoric acid group, a cyano group, an aldehyde group, an ester group, a carbonyl group, and the like. These monomers can be used singly or in combinations of two or more thereof. The polymer constituting the insulating fine particle is preferably a polymerized product of at least one selected from the styrenes, the esters, and the nitriles among others in that the rate of polymerization is high, and the product can easily be made spherical. When the polymer constituting the insulating fine particle has a plurality of constituent units, the form of existence of those constituent units in the polymer may be a random form, an alternate form, or a block form. The polymer constituting the insulating fine particle may be crosslinked or non-crosslinked.

When the insulating fine particle is a polymerized product of polymerizable compounds having an ethylenically unsaturated bond, at least one of the polymerizable compounds having an ethylenically unsaturated bond preferably has a phosphonium group.

The polymerizable compounds having an ethylenically unsaturated bond, the compounds having a phosphonium group, include 4-(vinylbenzyl)triethylphosphonium chloride, 4-(vinylbenzyl)trimethylphosphonium chloride, 4-(vinylbenzyl)tributylphosphonium chloride, 4-(vinylbenzyl)trioctylphosphonium chloride, 4-(vinylbenzyl)triphenylphosphonium chloride, 2-(methacryloyloxyethyl)trimethylphosphonium chloride, 2-(methacryloyloxyethyl)triethylphosphonium chloride, 2-(methacryloyloxyethyl)tributylphosphonium chloride, 2-(methacryloyloxyethyl)trioctylphosphonium chloride, 2-(methacryloyloxyethyl)triphenylphosphonium chloride, and the like. When the insulating fine particle is a copolymer of a polymerizable compound having an ethylenically unsaturated bond, the compound having a phosphonium group, and a polymerizable compound having an ethylenically unsaturated bond, the compound not having a phosphonium group, the polymerizable compound having a phosphonium group and the polymerizable compound not having a phosphonium group may be the same type or different types. Examples of the type as referred to herein include styrenes, olefins, esters, unsaturated carboxylic acids, amides, and nitriles, each described above. For example, at least one of the polymerizable compounds having a phosphonium group and an ethylenically unsaturated bond and at least one of the polymerizable compounds not having a phosphonium group but having an ethylenically unsaturated bond may be the same type, for example, styrenes.

Among others, the polymer constituting the insulating fine particle preferably has a constituent unit represented by the following general formula (1) from the standpoint of easy availability of monomers and easiness of polymer synthesis. Examples of R in formula (1) are as described above as the examples of R in general formula (2). The phosphonium group may be bonded to any of the para position, the ortho position, and the meta position to the CH group of the benzene ring in formula (1), and is preferably bonded to the para position. As monovalent $An^-$, halide ions are suitable. Examples of the halide ions include $Cl^-$, $F^-$, $Br^-$ and $I^-$.

[Formula 2]

(1)

wherein each R may be the same or different, and represents a straight-chain, branched-chain, or cyclic alkyl group, or an aryl group, and $An^-$ represents a monovalent anion.

In addition, the polymer constituting the insulating fine particle preferably has a constituent unit represented by the following general formula (3) from the standpoint of easy availability of monomers and easiness of polymer synthesis. Examples of R in formula (3) are as described above as the examples of R in general formula (2). As monovalent $An^-$, halide ions are suitable. Examples of the halide ions include $Cl^-$, $F^-$, $Br^-$ and $I^-$.

[Formula 3]

(3)

wherein each R may be the same or different, and represents a straight-chain, branched-chain, or cyclic alkyl group, or an aryl group, $An^-$ represents a monovalent anion, and n represents a number of 1 to 5.

In the polymer constituting the insulating fine particle, the proportion of the constituent unit to which a phosphonium group is bonded in all the constituent units is preferably 0.01 mol % or more and 5.0 mol % or less, and more preferably 0.02 mol % or more and 2.0 mol % or less. With respect to the number of constituent units in the polymer herein, a structure derived from one ethylenically unsaturated bond is counted as one constituent unit.

The polymer constituting the insulating fine particle is preferably a copolymer having two or more constituent units wherein at least one of the constituent units have an ester bond in the structure thereof. Thereby, the glass transition temperature of the polymer is easily made suitably low, the close adhesion property between the insulating fine particle and the metal-coated particle can be enhanced by enhancing the proportion of the area to come into contact with the metal-coated particle in the insulating fine particle, and the degree of bonding the insulating fine particles to one another can be enhanced, so that the insulation property among coated particles can be enhanced more.

The constituent unit having an ester bond in the structure thereof includes a constituent unit derived from a polymerizable compound having an ethylenically unsaturated bond and an ester bond in the structure thereof. Such a polymerizable compound includes the esters described above and specifically includes vinyl esters such as vinyl propionate and vinyl benzoate; and (meth)acrylic acid esters such as methyl (meth)acrylate, ethyl (meth)acrylate, propyl (meth)acrylate, butyl (meth)acrylate, hexyl (meth)acrylate, and phenyl (meth)acrylate; and the like. Among others, the polymerizable compound having an ethylenically unsaturated bond and an ester bond in the structure thereof is preferably a polymerizable compound having a group represented by —$COOR_1$ or —$OCOR_2$ ($R_1$ and $R_2$ each represent an alkyl group) in the structure thereof, and, among others, is preferably a compound in which these groups are bonded to $H_2C$=$CH^*$ or $H_2C$=$C(CH_3)^*$ (* represents a destination of the bond in the group represented by the above-described —$COOR_1$ or —$OCOR_2$) is preferable. $R_1$ and $R_2$ are each preferably a straight-chain or branched-chain alkyl group, and each preferably have 1 to 12 carbon atoms, and more preferably have 2 to 10 carbon atoms. These can be used singly or in combinations of two or more thereof.

In the polymer constituting the insulating fine particle, the proportion of the constituent unit having an ester bond in the structure thereof in all the constituent units is preferably 0.1 mol % or more and 30 mol % or less, and more preferably 1 mol % or more and 25 mol % or less from the viewpoint of setting the glass transition temperature of the insulating fine particle to a suitable range and from the viewpoint of capable of taking out the insulating fine particle produced during the progress of the polymerization reaction without melting of the insulating fine particle by heat and adhesion of the insulating fine particle to the wall face of the reaction container. With respect to the number of constituent units in the polymer herein, a structure derived from one unsaturated bond is counted as one constituent unit. A preferred example of the constituent unit having an ester bond in the structure thereof, as referred to herein, is represented by, for example, the following general formula (4).

[Formula 4]

(4)

wherein $R_3$ represents a hydrogen atom or a methyl group, and $R_4$ represents a group represented by —$COR_1$ or —$OCOR_2$.

The glass transition temperature of the insulating fine particle is preferably lower than the glass transition temperature of the core material of the metal-coated particle. Such constitution can easily enhance the proportion of the area to come into contact with the metal-coated particle in the insulating fine particle and the adhesion property among the insulating fine particles.

Particularly in the present embodiment, by using the insulating fine particle having a phosphonium group on the surface thereof as the insulating fine particle, the close adhesion of the insulating fine particle in a single layer to the metal-coated particle is enabled as described above, and by using the insulating fine particle having a low glass transition temperature as the insulating fine particle, the close adhesion property of the insulating fine particle to the metal-coated particle and the adhesion property among the insulating fine particles can further easily be enhanced. Accordingly, in the present embodiment, the insulation property among coated particles can effectively be enhanced.

More specifically, the glass transition temperature of the insulating fine particle is preferably 100° C. or lower, more preferably 95° C. or lower, and particularly preferably 90° C. or lower.

In addition, the glass transition temperature of the insulating fine particle is preferably 40° C. or higher from the standpoint of shape stability during storage or the like of the coated particle and easiness of synthesis of the insulating fine particle, more preferably 45° C. or higher, and particularly preferably 50° C. or higher. The glass transition temperature can be measured by the method described in Examples, which will be described later.

From the same standpoint described above, when the core material has a glass transition temperature, the difference between the glass transition temperature of the insulating fine particle and the glass transition temperature of the core material of the metal-coated particle is preferably 160° C. or less, more preferably 120° C. or less, and particularly preferably 100° C. or less. The difference between the glass transition temperature of the insulating fine particle and the glass transition temperature of the core material of the metal-coated particle is preferably 5° C. or more, and more preferably 10° C. or more.

Examples of a method for measuring the glass transition temperature include the following method.

The temperature of 0.04 to 0.06 g of a sample is elevated to 200° C., and the sample is cooled from the temperature to 25° C. at a rate of temperature drop of 5° C./min using a differential scanning calorimeter "STAR SYSTEM" (manufactured by METTLER TOLEDO). Subsequently, the temperature of the sample is elevated at a rate of temperature elevation of 5° C./min to measure the quantity of heat. When a peak is observed, the temperature at the peak is defined as the glass transition temperature, and when a peak is not observed, but a level difference is observed, the temperature at an intersection point of a tangential line showing a maximum inclination of the curve in the level difference part and an extended line of the base line on the high-temperature side of the level difference is defined as the glass transition temperature.

The average particle diameter (D) of the insulating fine particle is preferably 10 nm or more and 3,000 nm or less, and more preferably 15 nm or more and 2,000 nm or less. When the average particle diameter of the insulating fine particle is in the range, conduction between counter electrodes is thereby easily secured without allowing a resultant coated particle to cause short circuit in a direction different from the inter-counter electrode direction. It is to be noted that in the present invention, the average particle diameter of the insulating fine particle is a value measured in observation using a scanning electron microscope, and is specifically measured by the method described in Examples, which will be described later. When the insulating fine particle is spherical in a scanning electron microscope image, the particle diameter is a diameter of a circular image of the insulating fine particle. When the insulating fine particle is not spherical, the particle diameter refers to the longest length (maximum length) among the line segments crossing the image of the insulating fine particle.

The particle size distribution of the insulating fine particle measured by the above-described method has width. Generally, the width of the particle size distribution of a powder is represented by a coefficient of variation (Coefficient of Variation, hereinafter also referred to as "C.V.") expressed by the following calculation formula (1).

C.V. (%)=(standard deviation/average particle diameter)×100 (1)

A large C.V. indicates that the particle size distribution has width, and on the other hand, a small C.V. indicates that the particle size distribution is sharp. In the coated particle according to the present embodiment, the insulating fine particle having a C.V. of preferably 0.1% or more and 20% or less, more preferably 0.5% or more and 15% or less, and most preferably 1% or more and 10% or less is desirably used. When the C.V. is in this range, there is an advantage that the thickness of the coating layer by the insulating fine particle can be made uniform.

The coverage on the metal-coated particle by the insulating fine particle is preferably 5% or more and 100% or less, and more preferably 7% or more and 95% or less although it depends on the properties which a conductive material needs. In the coated particle according to the present invention, the insulating fine particle has a phosphonium group and thereby easily adheres closely to the metal-coated particle, so that the coverage can be enhanced without limitations in production temperature. The coated particle having a coverage in the range easily prevents the short circuit in directions different from the inter-counter electrode direction, so that conduction between counter electrodes is easily secured. It is to be noted that in the present invention, the coverage is measured by the method described in Examples, which will be described later.

In addition, the insulation layer may be a film containing a polymer and having a phosphonium group in place of the above-described insulation layer containing the insulating fine particle. When the insulation layer is a film having a phosphonium group, the coated particles are thermocompression-bonded between electrodes, the film is thereby melted, deformed, or peeled, and the metal surface of the metal-coated particle is thereby exposed, thereby enabling conduction between electrodes, so that connectivity is obtained. Particularly, when the film is broken by thermocompression-bonding the coated particles between electrodes, the metal surface is thereby often exposed. On the other hand, in the surface parts each facing a direction other than the thermocompression bonding direction in the coated particle, the coated state of the metal surface by the film is almost retained and therefore conduction in directions other than the thermocompression bonding direction is prevented.

Even if the insulation layer is composed of a film, when the film has a phosphonium group, the film thereby easily adheres closely to the metal-coated particle. In addition, when the film is obtained by heating the insulating fine particle as will be described later, the insulating fine particle to be a precursor for the insulation layer can be uniformly arranged, and therefore there is an effect such that the film thickness of the film obtained by melting of the insulating fine particle can be made uniform. By these reasons, even if the insulation layer is composed of a film, when the film has a phosphonium group, the short circuit prevention effect in directions different from the inter-counter electrode direction is thereby likely to be exhibited, so that the insulation property in the directions is improved to make the connection reliability high. When the insulation layer is the film having a phosphonium group, the film may be a film coating the whole surface of the metal-coated particle or coating a part of the surface. In addition, the surface of the film may be flat, or the film may have on the surface thereof unevenness derived from the fact that the film is obtained by heating the insulating fine particle.

The thickness of the film is preferably 10 nm or more from the standpoint of an improvement in the insulation property in directions different from the inter-counter electrode direction, and is preferably 3,000 nm or less from the standpoint of easy conduction between counter electrodes. From this standpoint, the thickness of the film is preferably 10 nm or more and 3,000 nm or less, and more preferably 15 nm or more and 2,000 nm or less.

As a part of the substance constituting the film, the phosphonium group in the film as well as the insulating fine particle preferably constitutes a part of the chemical structure of the substance. In the film, the phosphonium group is preferably contained in the structure of at least one of the constituent units of the polymer constituting the film. The phosphonium group is preferably chemically bonded to the polymer constituting the film and is more preferably bonded to a side chain of the polymer.

The phosphonium group which the film has includes the same as the phosphonium group which the insulating fine particle has.

In addition, the polymer constituting the film includes the same as the above-described polymer constituting the insulating fine particle. The glass transition temperature of the film includes the same as the above-described glass transition temperature of the insulating fine particle. The relationship between the glass transition temperature of the film and the glass transition temperature of the core material particle includes the same relationship as the above-described relationship between the glass transition temperature of the insulating fine particle and the glass transition temperature of the core material particle.

When the insulation layer is a film, the film is preferably a film obtained by coating the metal-coated particle with the insulating fine particle having a phosphonium group on the surface thereof and thereafter heating the insulating fine particle. In this case, as described above, the insulating fine particle easily adheres closely to the metal-coated particle, and thereby, the proportion of the surface coated with the insulating fine particle on the surface of the metal-coated particle is made sufficient, and peeling of the insulating fine particle from the metal-coated particle is likely to be prevented effectively. In addition, as described above, the insulating fine particle having a phosphonium group easily coat the metal-coated particle with a single layer thereof. From these reasons, the film obtained by heating the insulating fine particle coating the metal-coated particle can be made into a film having a uniform thickness and having a high coverage ratio on the surface of the metal-coated particle.

Under normal circumstances, it is desirable that the structure and properties of a film obtained by applying a heat treatment to a particular insulating fine particle be directly specified in the present specification after measuring all of the structures and properties using some measuring methods.

However, the structure or properties of other films having relationship with the effects of the present invention were not ascertained at a technical level of the applicant at least at the time when the present application was filed.

Even if all the factors are identified, there is a need for specifying the structure and properties of the films relating to those factors by establishing new measurement methods, and to do that, remarkably excessive expenditure and time are required.

From the above circumstances, the applicant describes that one of the preferred characteristics of the film according to the present invention is a film obtained by the above-described production method in view of the necessity of rapidity and the like in the characteristics of patent application.

Subsequently, a suitable method for producing the coated particle according to the present embodiment will be described.

The present production method includes:
a first step of polymerizing a polymerizable composition containing a polymerizable compound having a phosphonium group, thereby obtaining an insulating fine particle having a phosphonium group on a surface thereof; and
a second step of mixing a dispersion liquid containing the insulating fine particle with a metal-coated particle, thereby allowing the insulating fine particle to adhere to a surface of the metal-coated particle.

(First Step)

The polymerizable composition includes a polymerizable composition containing two or more polymerizable compounds, wherein at least one of the polymerizable compounds has a phosphonium group. The polymerizable compounds include the above-described polymerizable compounds. Preferred polymerizable compounds and constitutional ratios thereof include polymerizable compounds giving the above-described constituent units and their quantitative ratios.

The polymerization method includes emulsion polymerization, soap-free emulsion polymerization, dispersion polymerization, suspension polymerization, and the like, any of them may be used, and soap-free emulsion polymerization is preferable because there is an advantage that a monodispersed fine particle can be produced without using a surfactant. In the soap-free emulsion polymerization, a water-soluble initiator is used as a polymerization initiator. The polymerization may be performed in an inert atmosphere, such as nitrogen or argon.

The insulating fine particle having a phosphonium group on the surface thereof is obtained in the manner as described above.

(Second Step)

Subsequently, a dispersion liquid containing the insulating fine particle and the metal-coated particle are mixed to allow the insulating fine particle to adhere to the surface of the metal-coated particle.

A liquid medium of the dispersion liquid includes water and an organic solvent, and a mixture thereof, and water is preferable.

The dispersion liquid preferably contains an inorganic salt or an organic salt from the standpoint of easily obtaining a coated particle having a certain coverage or more. As the inorganic salt and the organic salt, those dissociating an anion are suitably used, and as the anion, $Cl^-$, $F^-$, $Br^-$, $I^-$, $SO_4^{2-}$, $CO_3^{2-}$, $NO_3^-$, $COO^-$, and the like are suitable. As the inorganic salt, for example, $NaCl$, $KCl$, $LiCl$, $MgCl_2$, $BaCl_2$, $NaF$, $KF$, $LiF$, $MgF_2$, $BaF_2$, $NaBr$, $KBr$, $LiBr$, $MgBr_2$, $BaBr_2$, $NaI$, $KI$, $LiI$, $MgI_2$, $BaI_2$, $Na_2SO_4$, $K_2SO_4$, $Li_2SO_4$, $MgSO_4$, $Na_2CO_3$, $NaHCO_3$, $K_2CO_3$, $KHCO_3$, $Li_2CO_3$, $LiHCO_3$, $MgCO_3$, $NaNO_3$, $KNO_3$, $LiNO_3$, $MgNO_3$, $BaNO_3$, or the like can be used. As the organic salt, Na oxalate, Na acetate, Na citrate, Na tartarate, or the like can be used.

Preferred concentration of the inorganic salt and the organic salt is different depending on the extent of the coating area of the insulating fine particle in the surface area of the metal-coated particle, and the concentration is preferably, for example, 5 mmol/L or more and 100 mmol/L or less in the dispersion liquid after the mixing with the metal-coated particle because the coated particle having a preferred coverage, wherein the insulating fine particle is made into a single layer, is easily obtained. From this viewpoint, the concentration of the inorganic salt and the organic salt in the dispersion liquid is more preferably 5 mmol/L or more and 100 mmol/L or less, and particularly preferably 10 mmol/L or more and 80 mmol/L or less.

As the metal-coated particle to be mixed with the dispersion liquid, the metal-coated particle itself may be used, or a dispersion liquid of the metal-coated particle may be used. In the dispersion liquid after the mixing with the metal-coated particle, the insulating fine particle is preferably contained in an amount of 10 ppm or more and 50,000 ppm or less, and more preferably 250 ppm or more and 10,000 ppm or less on a mass basis. In the dispersion liquid after the mixing with the metal-coated particle, the metal-coated particle is preferably contained in an amount of 100 ppm or more and 100,000 ppm or less, and more preferably 500 ppm or more and 80,000 ppm or less on a mass basis.

The temperature of the dispersion liquid at a point in time when the dispersion liquid is mixed with the metal-coated particle is generally 20° C. or higher and 100° C. or lower from the standpoint of easily obtaining a coated particle having a constant quality, and particularly preferably 40° C. or higher. Particularly, when the glass transition temperature of the insulating fine particle is assumed to be Tg° C., the temperature of the dispersion liquid is preferably Tg−30° C. or higher and Tg+30° C. or lower, and more preferably Tg−15° C. or higher and Tg+15° C. or lower. The temperature is preferably in this range because the insulating fine particle adheres closely to the metal-coated particle while keeping the shape thereof, so that a suitable contact area is easily obtained between the insulating fine particle and the metal-coated particle. Besides, the insulating fine particle having a phosphonium group according to the present invention has a high affinity with the metal-coated particle, and therefore the insulating fine particle can coat the metal-coated particle sufficiently when the temperature of the dispersion liquid is in the temperature range.

In the dispersion liquid after the mixing with the metal-coated particle, the time provided for allowing the insulating fine particle to adhere to the metal-coated particle is preferably 0.1 hours or longer and 24 hours or shorter. The dispersion liquid is preferably stirred during the time. Subsequently, the solid component in the dispersion liquid is washed and dried as necessary to obtain the coated particle in which the insulating fine particle having a phosphonium group has adhered to the surface of the metal-coated particle is obtained.

As described above, by heating the coated particle in which the insulating fine particle has adhered to the surface of the metal-coated particle, the insulating fine particle is made into a molten state and can coat the metal-coated particle in the form of a film. By making the insulating fine particle into the form of a film, the insulation property is made stronger. The heating method includes a method of warming the dispersion liquid after allowing the insulating fine particle to adhere to the surface of the metal-coated particle, a method of warming the coated particle in a solvent such as water, a method of warming the coated particle in a gas phase such as an inert gas, and the like. From the standpoint of easily forming the insulating fine particle into the form of a uniform film without allowing the insulating fine particle to fall off, the heating temperature is preferably Tg+1° C. or higher and Tg+60° C. or lower, more preferably Tg+5° C. or higher and Tg+50° C. or lower, and most preferably higher than Tg+15° C. when the glass transition temperature of the polymer constituting the insulating fine particle is assumed to be Tg. In addition, when the coated particle is heated in a gas phase, warming can be carried out under atmospheric pressure, reduced pressure, or elevated pressure as the pressure condition.

An annealing treatment may be performed on the coated particle in which the surface of the metal-coated particle is coated in the form of a film in order to make the film more stable. The annealing treatment method includes a method of warming the coated particle in a gas phase such as an inert gas, and the like. The heating temperature is preferably Tg+1° C. or higher and Tg+60° C. or lower, and more preferably Tg+5° C. or higher and Tg+50° C. or lower when the glass transition temperature of the polymer constituting the insulating fine particle is assumed to be Tg. The heating atmosphere is not particularly limited, and heating can be carried out under any condition of atmospheric pressure, reduced pressure, or elevated pressure in an inert gas atmosphere such as nitrogen or argon, or an oxidative atmosphere such as air.

The preferred production method is described above, but the coated particle according to the present invention can also be produced by other production methods. For example, a phosphonium group may be introduced on the surface of the insulating fine particle by producing an insulating fine particle not having a phosphonium group in advance through a polymerization reaction, and reacting the obtained insulating fine particle with a compound having a phosphonium group, or by other methods.

The coated particle obtained in the manner as described above is suitably used as a conductive material for a conductive adhesive, an anisotropic conductive film, an anisotropic conductive adhesive, or the like utilizing the insulation property among coated particles and the connectivity between counter electrodes, which are brought about by an advantage of using the insulating fine particle or insulating film having a phosphonium group.

EXAMPLES

Hereinafter, the present invention will be described by Examples. However, the scope of the present invention is not limited to these Examples. The properties in examples were measured by the following methods.

(1) Average Particle Diameter

From a scanning electron microscope (SEM) photograph (100,000 magnifications) of an object of measurement, 200 particles were extracted arbitrarily to measure the particle diameters of the particles, and the average value of the particle diameters was defined as the average particle diameter.

(2) C.V. (Coefficient of Variation)

The C.V. was determined from the measurement of the average particle diameter by the following formula.

$$C.V. (\%) = (\text{standard deviation}/\text{average particle diameter}) \times 100$$

(3) Glass Transition Temperature

A change in the quantity of heat from the measurement temperature of 25° C. to 200° C. was measured by the above-described procedure with a differential scanning calorimeter (STAR SYSTEM, manufactured by METTLER TOLEDO) at a rate of temperature elevation and drop of 5° C./min in a nitrogen atmosphere.

Production Example 1

Figure 1:
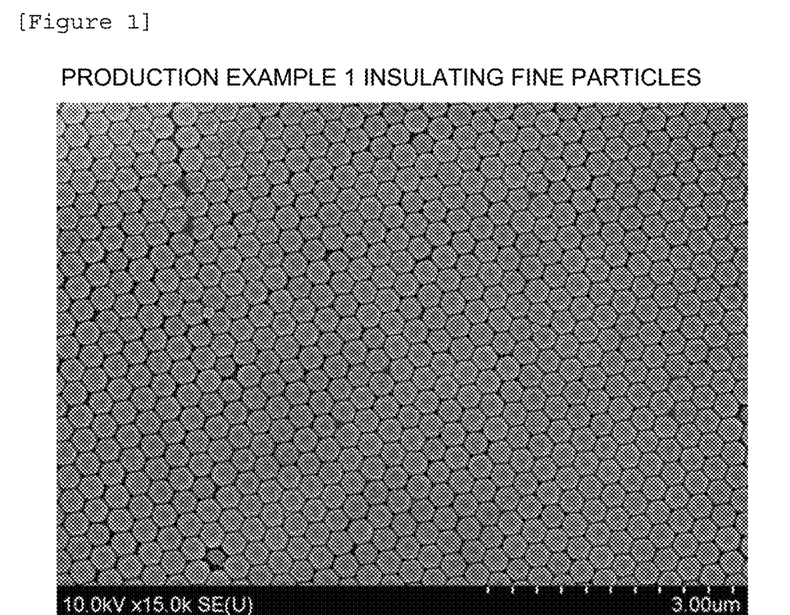
FIG. 1 is a photograph of insulating fine particles obtained in Production Example 1, the fine particles observed with a scanning electron microscope (SEM).

To a 200-mL four-neck flask equipped with an impeller having a length of 60 mm, 100 mL of pure water was charged. Thereafter, 30.00 mmol of a styrene monomer (manufactured by KANTO CHEMICAL CO., INC.), 0.03 mmol of 4-(vinylbenzyl)triethylphosphonium chloride (manufactured by NIPPON CHEMICAL INDUSTRIAL CO., LTD.), and, as a polymerization initiator, 0.50 mmol of 2,2'-azobis(2-methylpropionamidine) dihydrochloride (V-50, manufactured by FUJI FILM Wako Pure Chemical Corporation) were charged. After nitrogen was allowed to flow in a resultant mixture for 15 minutes to remove dissolved oxygen, the temperature was elevated to 60° C. and retained at the temperature for 6 hours, thereby allowing a polymerization reaction to progress. A dispersion liquid containing a fine particle after the polymerization was allowed to pass through an SUS sieve having an aperture of 150 μm to remove aggregates. The fine particle in the dispersion liquid from which the aggregates had been removed was settled with a centrifugal separator (CR-21N, manufactured by Koki Holdings Co., Ltd.) under a condition of 20,000 rpm for 20 minutes to remove a supernatant liquid. Pure water was added to an obtained solid product to wash the solid product, and thus a spherical fine particle of poly(styrene/4-(vinylbenzyl) triethylphosphonium chloride) was obtained. The obtained fine particle had an average particle diameter of 270 nm and a C.V. of 3.9%. The glass transition temperature was about 105° C. FIG. 1 shows an SEM photograph of the obtained insulating fine particle.

Production Example 2

Figure 2:
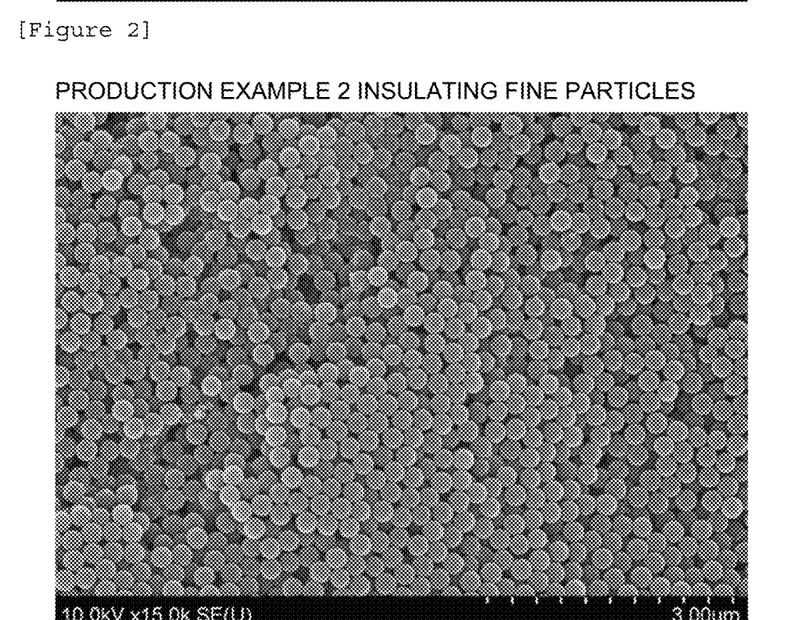
FIG. 2 is a photograph of insulating fine particles obtained in Production Example 2, the fine particles observed with an SEM.

The same reaction apparatus as the one in Production Example 1 was used, 30.00 mmol of a styrene monomer (manufactured by KANTO CHEMICAL CO., INC.), 5.3 mmol of n-butyl acrylate (manufactured by KANTO CHEMICAL CO., INC.), 0.03 mmol of 4-(vinylbenzyl) triethylphosphonium chloride (manufactured by NIPPON CHEMICAL INDUSTRIAL CO., LTD.), and, as a polymerization initiator, 0.50 mmol of 2,2'-azobis(2-methylpropionamidine)dihydrochloride (V-50, manufactured by FUJI FILM Wako Pure Chemical Corporation) were charged, and polymerization and a post-treatment were performed under the same conditions as in Production Example 1 to obtain a spherical fine particle of poly(styrene/n-butyl acrylate/4-(vinylbenzyl)triethylphosphonium chloride). The obtained fine particle had an average particle diameter of 245 nm and a C.V. of 3.6%. The glass transition temperature was about 62° C. FIG. 2 shows an SEM photograph of the obtained insulating fine particle.

Production Example 3

Figure 3:
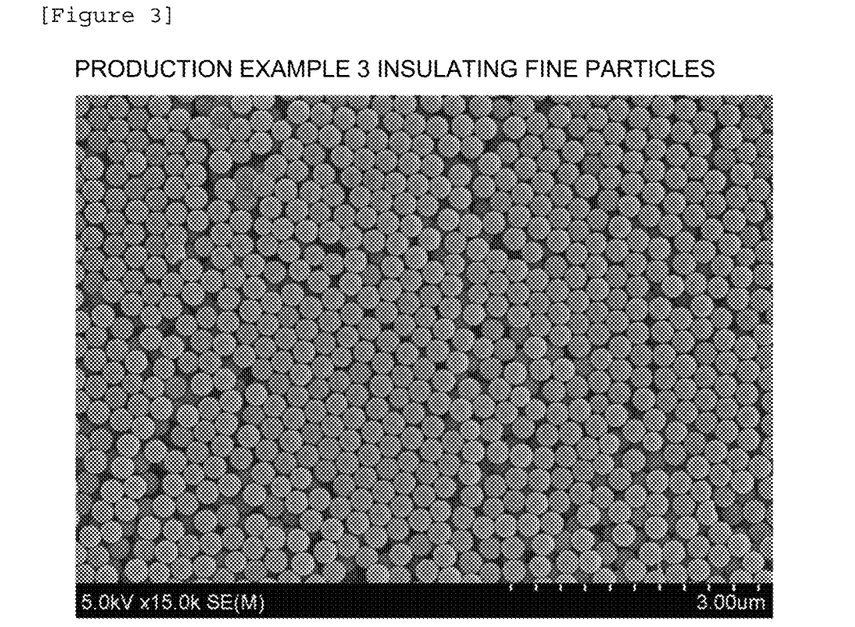
FIG. 3 is a photograph of insulating fine particles obtained in Production Example 3, the fine particles observed with an SEM.

The same reaction apparatus as the one in Production Example 1 was used, 30.00 mmol of a styrene monomer (manufactured by KANTO CHEMICAL CO., INC.), 0.03 mmol of 4-(vinylbenzyl)triethylammonium chloride (manufactured by NIPPON CHEMICAL INDUSTRIAL CO., LTD.), and, as a polymerization initiator, 0.50 mmol of 2,2'-azobis(2-methylpropionamidine) dihydrochloride (V-50, manufactured by FUJI FILM Wako Pure Chemical Corporation) were charged, and polymerization and a post-treatment were performed under the same conditions as in Production Example 1 to obtain a spherical fine particle of poly(styrene/4-(vinylbenzyl)triethylammonium chloride). The obtained fine particle had an average particle diameter of 272 nm and a C.V. of 3.3%. The glass transition temperature was about 102° C. FIG. 3 shows an SEM photograph of the obtained insulating fine particle.

Example 1

Figure 4:
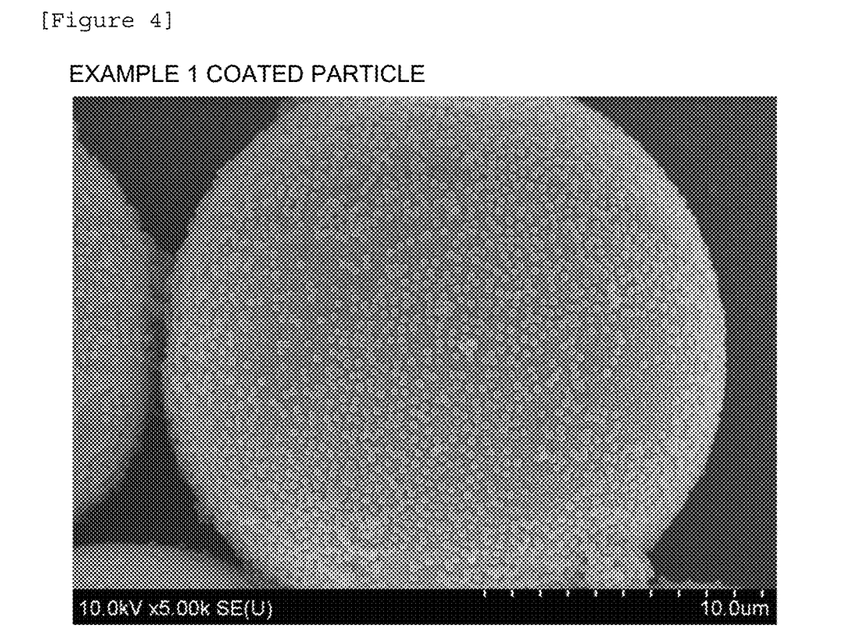
FIG. 4 is a photograph of a coated particle obtained in Example 1, the particle observed with an SEM.

A fine particle dispersion liquid was prepared by adding pure water and NaCl so that the solid concentration of the fine particle obtained in Production Example 1 would be 10,000 ppm on a mass basis, the NaCl concentration would be 25 mmol/L, and the whole amount would be 20 mL. To this dispersion liquid, 50 mg of an Ni-plated particle (manufactured by NIPPON CHEMICAL INDUSTRIAL CO., LTD.) having a particle diameter of 20 μm was added, and a resultant mixture was stirred at room temperature (25° C.) for 15 hours. This Ni-plated particle is a spherical particle obtained by plating the surface of a spherical resin particle composed of a crosslinkable acrylic resin and having a glass transition temperature of 120° C. with nickel so that the thickness of a nickel film would be a thickness within the range described as a preferred thickness of the metal film. A solid body was separated with a membrane filter having an aperture of 10 μm from the dispersion liquid after the stirring, thereafter washed with pure water, and dried to obtain a coated particle such that the surface is coated with a fine particle of poly(styrene/4-(vinylbenzyl)triethylphosphonium chloride) in a single layer. FIG. 4 shows an SEM photograph of the coated particle obtained.

Example 2

Figure 5:
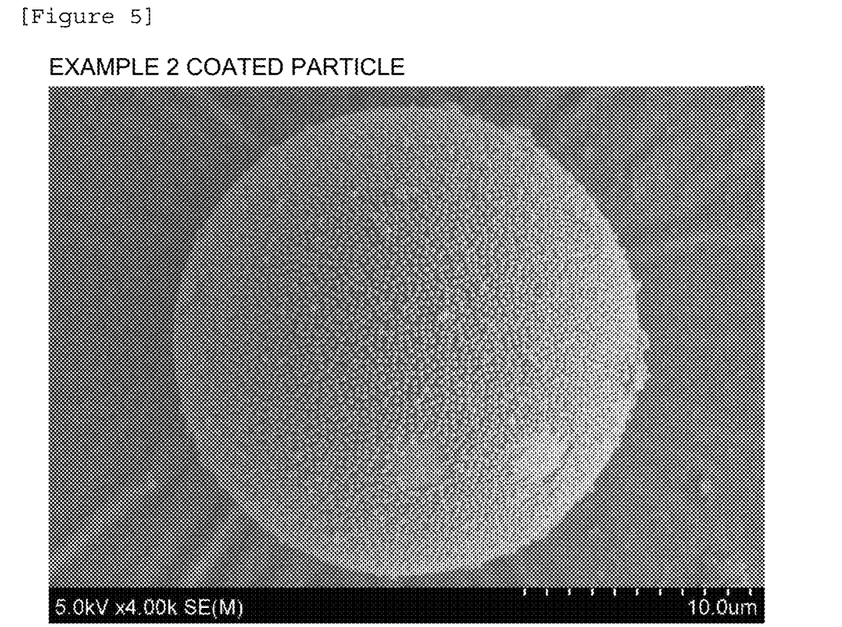
FIG. 5 is a photograph of a coated particle obtained in Example 2, the particle observed with an SEM.

A fine particle dispersion liquid was prepared by adding pure water and NaCl so that the solid concentration of the fine particle obtained in Production Example 1 would be 10,000 ppm on a mass basis, the NaCl concentration would be 25 mmol/L, and the whole amount would be 20 mL. To this dispersion liquid, 50 mg of an Au-plated particle (manufactured by NIPPON CHEMICAL INDUSTRIAL CO., LTD.) having a particle diameter of 20 μm was added, and a resultant mixture was stirred at room temperature (25° C.) for 15 hours. This Au-plated particle is a spherical particle obtained by plating the surface of a spherical resin particle composed of a crosslinkable acrylic resin and having a glass transition temperature of 120° C. with gold so that the thickness of a gold film would be a thickness within the range described as a preferred thickness of the metal film. A solid body was separated with a membrane filter having an aperture of 10 μm from the dispersion liquid after the stirring, thereafter washed with pure water, and dried to obtain a coated particle such that the surface is coated with a fine particle of poly(styrene/4-(vinylbenzyl)triethylphosphonium chloride) in a single layer. FIG. 5 shows an SEM photograph of the coated particle obtained.

Example 3

Figure 6:
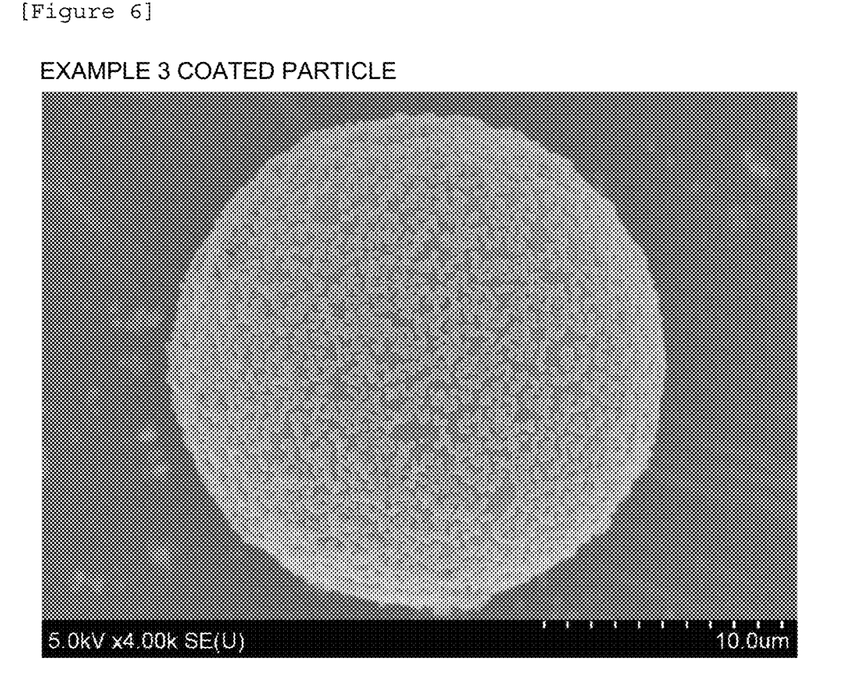
FIG. 6 is a photograph of a coated particle obtained in Example 3, the particle observed with an SEM.

A fine particle dispersion liquid was prepared by adding pure water and NaCl so that the solid concentration of the fine particle obtained in Production Example 1 would be 10,000 ppm on a mass basis, the NaCl concentration would be 25 mmol/L, and the whole amount would be 20 mL. To this dispersion liquid, 50 mg of an Ni-plated particle (manufactured by NIPPON CHEMICAL INDUSTRIAL CO., LTD.) having a particle diameter of 20 μm was added, and a resultant mixture was stirred at 70° C. for 15 hours. This Ni-plated particle is the same as the one used in Example 1. A solid body was separated with a membrane filter having an aperture of 10 μm from the dispersion liquid after the stirring, thereafter washed with pure water, and dried to obtain a coated particle such that the surface is coated with a fine particle of poly(styrene/4-(vinylbenzyl)triethylphosphonium chloride) in a single layer. FIG. 6 shows an SEM photograph of the coated particle obtained.

Example 4

Figure 7:
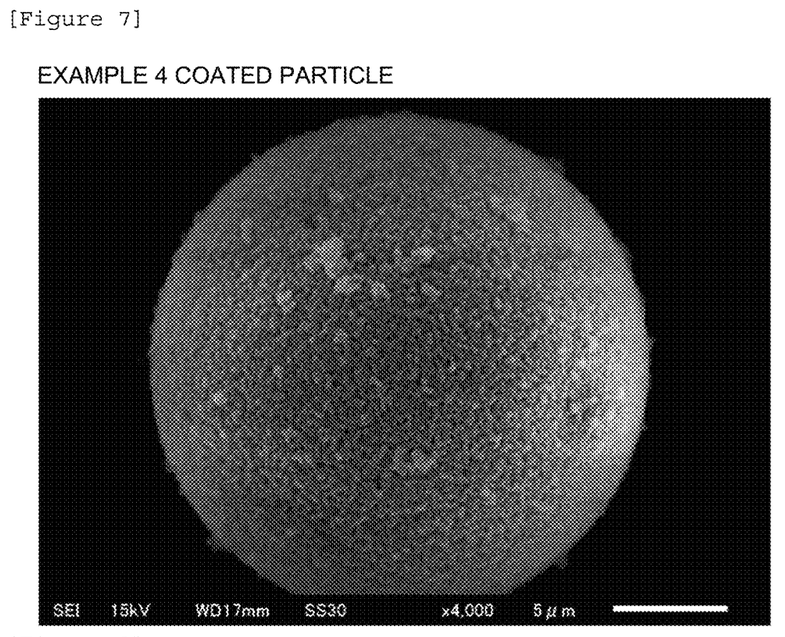
FIG. 7 is a photograph of a coated particle obtained in Example 4, the particle observed with an SEM.

A fine particle dispersion liquid was prepared by adding pure water and NaCl so that the solid concentration of the fine particle obtained in Production Example 2 would be 10,000 ppm on a mass basis, the NaCl concentration would be 25 mmol/L, and the whole amount would be 20 mL. To this dispersion liquid, 50 mg of an Ni-plated particle (manufactured by NIPPON CHEMICAL INDUSTRIAL CO., LTD.) having a particle diameter of 20 μm was added, and a resultant mixture was stirred at 70° C. for 15 hours. This Ni-plated particle is the same as the one used in Example 1. A solid body was separated with a membrane filter having an aperture of 10 μm from the dispersion liquid after the stirring, thereafter washed with pure water, and dried to obtain a coated particle such that the surface is coated with a fine particle of poly(styrene/n-butyl acrylate/4-(vinylbenzyl)triethylphosphonium chloride) in a single layer. FIG. 7 shows an SEM photograph of the coated particle obtained.

Example 5

Figure 8:
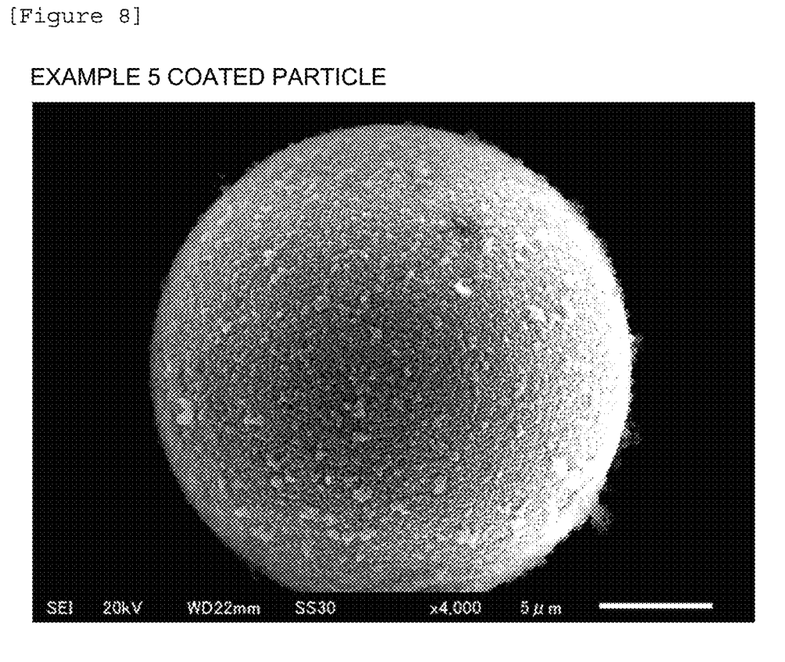
FIG. 8 is a photograph of a coated particle obtained in Example 5, the particle observed with an SEM.

A fine particle dispersion liquid was prepared by adding pure water and NaCl so that the solid concentration of the fine particle obtained in Production Example 2 would be 10,000 ppm on a mass basis, the NaCl concentration would be 25 mmol/L, and the whole amount would be 20 mL. To this dispersion liquid, 50 mg of an Au-plated particle (manufactured by NIPPON CHEMICAL INDUSTRIAL CO., LTD.) having a particle diameter of 20 μm was added, and a resultant mixture was stirred at 70° C. for 15 hours. This Au-plated particle is the same as the one used in Example 2. A solid body was separated with a membrane filter having an aperture of 10 μm from the dispersion liquid after the stirring, thereafter washed with pure water, and dried to obtain a coated particle such that the surface is coated with a fine particle of poly(styrene/n-butyl acrylate/4-(vinylbenzyl)triethylphosphonium chloride) in a single layer. FIG. 8 shows an SEM photograph of the coated particle obtained.

Example 6

Figure 9:
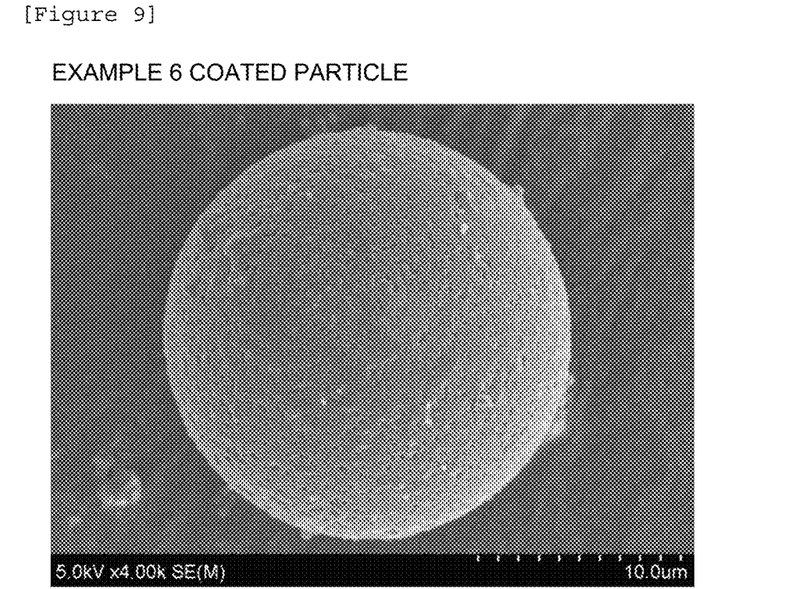
FIG. 9 is a photograph of a coated particle obtained in Example 6, the particle observed with an SEM.

To 20 mL of pure water, 50 mg of the coated particle obtained in Example 4 was added, and a resultant mixture was stirred at 80° C. for 6 hours. After the stirring was completed, a solid body was separated with a membrane filter having an aperture of 10 μm, and thereafter dried to obtain a coated particle such that the whole surface of the metal-coated particle is coated with a film having a thickness of 150 nm. FIG. 9 shows an SEM photograph of the coated particle obtained.

It is to be noted that the thickness of the film was measured by the following method.
<Method for Measuring Thickness of Film>

The diameter of the metal-coated particle after the film formation was measured for 200 particles with an SEM to calculate the average value. The diameter of the metal-coated particle before allowing the insulating fine particle to adhere was measured for 200 particles with an SEM in the same manner to calculate the average value. Half of the difference between the average values of these diameters was defined as the thickness of the film.

Comparative Example 1

Figure 10:
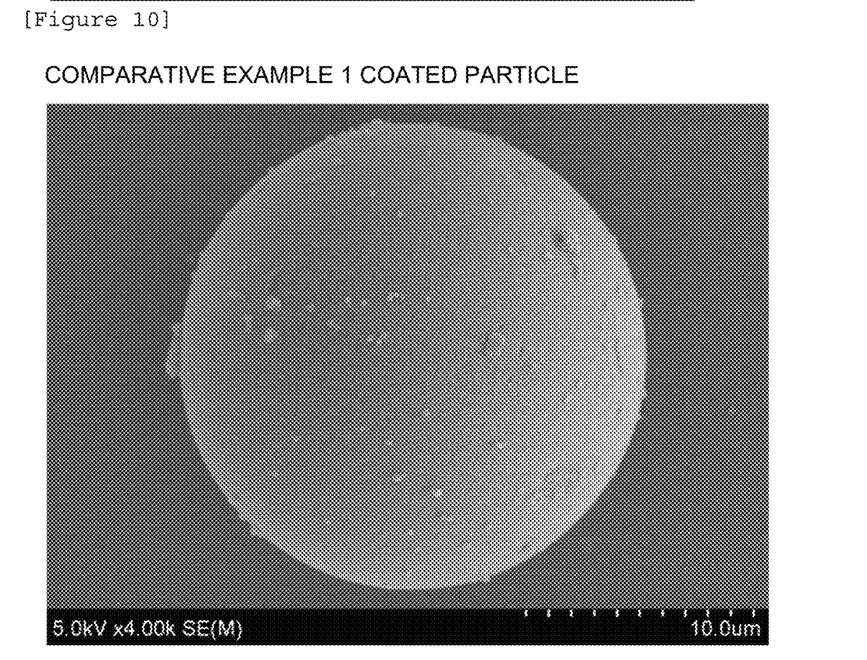
FIG. 10 is a photograph of a coated particle obtained in Comparative Example 1, the particle observed with an SEM.

A fine particle dispersion liquid was prepared by adding pure water and NaCl so that the solid concentration of the fine particle obtained in Production Example 3 would be 10,000 ppm on a mass basis, the NaCl concentration would be 25 mmol/L, and the whole amount would be 20 mL. To this dispersion liquid, 50 mg of an Ni-plated particle (manufactured by NIPPON CHEMICAL INDUSTRIAL CO., LTD.) having a particle diameter of 20 μm was added, and a resultant mixture was stirred at room temperature (25° C.) for 15 hours. This Ni-plated particle is the same as the one used in Example 1. A solid body was separated with a membrane filter having an aperture of 10 μm from the dispersion liquid after the stirring, thereafter washed with pure water, and dried to obtain a coated particle such that the surface is coated with a fine particle of poly(styrene/4-(vinylbenzyl)triethylammonium chloride). FIG. 10 shows an SEM photograph of the coated particle obtained.

It is found that the number of insulating fine particles with which the coated particle is coated is smaller as compared to the SEM photograph (FIG. 4) of Example 1 where the coating conditions are the same.

Comparative Example 2

Figure 11:
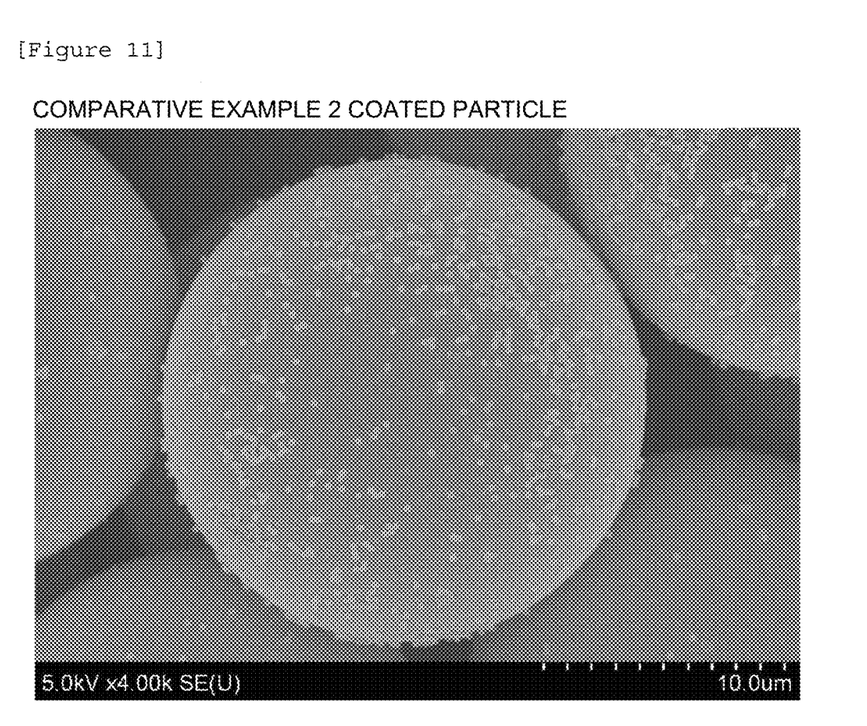
FIG. 11 is a photograph of a coated particle obtained in Comparative Example 2, the particle observed with an SEM.

A fine particle dispersion liquid was prepared by adding pure water and NaCl so that the solid concentration of the fine particle obtained in Production Example 3 would be 10,000 ppm on a mass basis, the NaCl concentration would be 25 mmol/L, and the whole amount would be 20 mL. To this dispersion liquid, 50 mg of an Ni-plated particle (manufactured by NIPPON CHEMICAL INDUSTRIAL CO., LTD.) having a particle diameter of 20 µm was added, and a resultant mixture was stirred at 70° C. for 15 hours. This Ni-plated particle is the same as the one used in Example 1. A solid body was separated with a membrane filter having an aperture of 10 µm from the dispersion liquid after the stirring, thereafter washed with pure water, and dried to obtain a coated particle such that the surface is coated with a fine particle of poly(styrene/4-(vinylbenzyl)triethylammonium chloride). FIG. 11 shows an SEM photograph of the coated particle obtained.

(Evaluation of Coverage)

The difference in the coverage due to the difference in the treatment temperature in coating the Ni-plated particle with the insulating fine particle was evaluated from the coated particles obtained in Example 1, Example 3, Comparative Example 1, and Comparative Example 2. Table 1 shows the results. It is to be noted that the coverage was determined by the following method.

<Method for Measuring Coverage>

The number N of insulating fine particles, when arranged on the surface of the Ni-plated particle by closest packing, was calculated by the following calculation formula.

$$N = 4\pi(R+r)^2/2\sqrt{3}r^2$$

(R: radius (nm) of Ni-plated particle, r: radius (nm) of insulating fine particle)

The number n of insulating fine particles which had adhered to the Ni-plated particle was counted with the SEM to calculate the coverage from the following formula.

$$\text{Coverage (\%)} = (n/N) \times 100$$

The coverage used for evaluation was the average value of 20 Ni-plated particles.

TABLE 1

| | Insulating fine particle | Treatment temperature | Coverage |
|---|---|---|---|
| Example 1 | Poly(styrene/4-(vinylbenzyl) triethylphosphonium chloride) | Room temperature (25° C.) | 13.4% |
| Example 3 | Poly(styrene/4-(vinylbenzyl) triethylphosphonium chloride) | 70° C. | 15.9% |
| Comparative Example 1 | Poly(styrene/4-(vinylbenzyl) triethylammonium chloride) | Room temperature (25° C.) | 1.1% |
| Comparative Example 2 | Poly(styrene/4-(vinylbenzyl) triethylammonium chloride) | 70° C. | 6.9% |

From this result, a large difference in the coverage was not found between Example 1 and Example 3 where the insulating fine particle has a phosphonium group, but a large difference in the coverage was found between Comparative Example 1 and Comparative Example 2 where the insulating fine particle has an ammonium group. It can be seen from this that the phosphonium group has a higher affinity with nickel (easiness of adhering closely to metal-coated particle) than the ammonium group irrespective of the treatment temperature. In addition, it can be seen that the phosphonium group gives a higher coverage and has a higher affinity with nickel (easiness of adhering closely to metal-coated particle) than the ammonium group at the same treatment temperature. As can be seen from those described above, the coated particle according to the present invention is excellent in connection reliability, and the coated particle can be produced in an industrially advantageous manner.

INDUSTRIAL APPLICABILITY

The coated particle according to the present invention is excellent in affinity with a metal layer of a conductive metal-coated particle and has excellent connection reliability owing to a phosphonium group which the insulation layer has. In addition, the method for producing a coated particle according to the present invention can produce the coated particle according to the present invention by an industrially advantageous method.

The invention claimed is:

1. A coated particle comprising:
   a conductive metal-coated particle having a metal film formed on a surface of a core material; and
   an insulation layer comprising a polymer coating the metal-coated particle, wherein the insulation layer has a phosphonium group.

2. The coated particle according to claim 1, wherein
   the insulation layer comprises an insulating fine particle and the fine particle has a phosphonium group on a surface thereof, or
   the insulation layer is a film having a phosphonium group.

3. The coated particle according to claim 2, wherein the insulating fine particle has an average particle diameter of 10 nm or more and 3,000 nm or less.

4. The coated particle according to claim 1, wherein the metal is at least one selected from nickel, gold, nickel alloys, and gold alloys.

5. The coated particle according to claim 1, wherein the polymer constituting the insulation layer is at least one polymerized product selected from styrenes, esters, and nitriles.

6. The coated particle according to claim 1, wherein the polymer is a copolymer comprising two or more constituent units, and at least one of the constituent units has an ester bond in a structure thereof.

7. The coated particle according to claim 2, wherein the insulating fine particle has a coefficient of variation (C.V.) of 0.1% or more and 20% or less.

8. The coated particle according to claim 1, wherein the insulation layer has a glass transition temperature of 40° C. or higher and 100° C. or lower.

9. The coated particle according to claim 1, wherein the insulation layer has a glass transition temperature of 50° C. or higher and 90° C. or lower.

10. The coated particle according to claim 1, wherein the polymer is a polymerized product of a polymerizable compound having an ethylenically unsaturated bond, and the phosphonium group represented by the following general formula (2) is bonded to a side chain of the polymer:

(2)

wherein each R represents a straight-chain, branched-chain, or cyclic alkyl group, or an aryl group, and may be the same or different, and * represents a bond.

11. The coated particle according to claim 10, wherein R in the general formula (2) represents a straight-chain alkyl group having 1 to 12 carbon atoms.

12. The coated particle according to claim 11, wherein R in the general formula (2) represents a methyl group, an ethyl group, a butyl group, or an octyl group.

13. The coated particle according to claim 10, wherein the polymerizable compound having an ethylenically unsaturated bond comprises at least one polymerizable compound selected from 4-(vinylbenzyl)triethylphosphonium chloride, 4-(vinylbenzyl)trimethylphosphonium chloride, 4-(vinylbenzyl)tributylphosphonium chloride, 4-(vinylbenzyl)trioctylphosphonium chloride, 4-(vinylbenzyl)triphenylphosphonium chloride, 2-(methacryloyloxyethyl)trimethylphosphonium chloride, 2-(methacryloyloxyethyl)triethylphosphonium chloride, 2-(methacryloyloxyethyl)tributylphosphonium chloride, 2-(methacryloyloxyethyl)trioctylphosphonium chloride, and 2-(methacryloyloxyethyl)triphenylphosphonium chloride.

14. The coated particle according to claim 1, wherein the polymer comprises a constituent unit represented by the following general formula (3):

(3)

wherein each R may be the same or different and represents a straight-chain, branched-chain, or cyclic alkyl group, or an aryl group, $An^-$ represents a monovalent anion, and n represents a number of 1 to 5.

15. The coated particle according to claim 14, wherein R in the general formula (3) represents a straight-chain alkyl group having 1 to 12 carbon atoms.

16. The coated particle according to claim 15, wherein R in the general formula (3) represents a methyl group, an ethyl group, a butyl group, or an octyl group.

17. A method for producing a coated particle containing a metal-coated particle having a metal formed on a surface of a core material, the metal-coated particle coated with an insulation layer comprising a polymer, the method comprising:

a step of polymerizing a polymerizable composition comprising a polymerizable compound having a phosphonium group, thereby obtaining an insulating fine particle having a phosphonium group on a surface thereof; and a step of mixing a dispersion liquid comprising the insulating fine particle with the metal-coated particle, thereby allowing the insulating fine particle to adhere to a surface of the metal-coated particle.

18. The method for producing a coated particle according to claim 17, further comprising a step of heating the coated particle obtained by allowing the insulating fine particle to adhere to the surface of the metal-coated particle, thereby making the insulating fine particle into a form of a film.

* * * * *